United States Patent
Shreeve

(10) Patent No.: US 9,553,512 B1
(45) Date of Patent: *Jan. 24, 2017

(54) METHOD AND APPARATUS FOR PROVIDING A REGULATED OUTPUT VOLTAGE VIA A VOLTAGE REGULATOR BASED ON MULTIPLE VOLTAGE REFERENCES

(71) Applicant: Marvell International LTD., Hamilton (BM)

(72) Inventor: Robert W. Shreeve, Corvallis, OR (US)

(73) Assignee: MARVELL INTERNATIONAL LTD., Hamilton (BM)

(*) Notice: Subject to any disclaimer, the term of this patent is extended or adjusted under 35 U.S.C. 154(b) by 124 days.

This patent is subject to a terminal disclaimer.

(21) Appl. No.: 14/617,048

(22) Filed: Feb. 9, 2015

Related U.S. Application Data

(63) Continuation of application No. 14/190,729, filed on Feb. 26, 2014, now Pat. No. 8,952,747.

(Continued)

(51) Int. Cl.
G05F 3/02 (2006.01)
G05F 1/10 (2006.01)
H02M 3/156 (2006.01)

(52) U.S. Cl.
CPC .................. H02M 3/156 (2013.01)

(58) Field of Classification Search
CPC .................................................. H02M 3/156

(Continued)

(56) References Cited

U.S. PATENT DOCUMENTS 6,144,606 A * 11/2000 Pan .................... G11C 5/147
365/189.07
6,459,554 B1 * 10/2002 Meiners ................ H01H 47/32
327/306

(Continued)

OTHER PUBLICATIONS

IEEE P802.11ad / D5.0 (Draft Amendment based on IEEE P802.11REVmb D10.0) (Amendment to IEEE 802.11REVmb D10.0 as amended by IEEE 802.11ae D5.0 and IEEE 802.11aa D6.0); Draft Standard for Information Technology—Telecommunications and Information Exchange Between Systems—Local and Metropolitan Area Networks—Specific Requirements; Part 11: Wireless LAN Medium Access Control (MAC) and Physical Layer (PHY) Specifications—Amendment 3: Enhancements for Very High Throughput in the 60 GHz Band; Sponsor IEEE 802.11 Committee of the IEEE Computer Society; Sep. 2011; 601 pages.

(Continued)

*Primary Examiner* — Ryan Jager

(57) ABSTRACT

A voltage regulator including a comparing circuit, a first circuit, a transistor, a voltage reference circuit, and a latching circuit. The comparing circuit compares a first and second voltage references and generates an output based on the comparison. The first circuit amplifies the output of the comparing circuit. The transistor includes: a gate configured to receive a first output of the first circuit; a first terminal connected to a voltage supply terminal; and a second terminal. A regulated output voltage of the voltage regulator is based on a voltage at the second terminal. The voltage reference circuit generates the second voltage reference based on the voltage at the second terminal. The latching circuit, based on a second output of the first circuit: adjusts the second voltage reference; and switches between forcing the second output of the first circuit to be in a first state to be in a second state.

20 Claims, 4 Drawing Sheets

Related U.S. Application Data

(60) Provisional application No. 61/770,701, filed on Feb. 28, 2013.

(58) Field of Classification Search
USPC .......................................................... 327/538
See application file for complete search history.

(56) References Cited

U.S. PATENT DOCUMENTS

| | | | | |
|---|---|---|---|---|
| 6,714,067 | B1* | 3/2004 | Farrenkopf | H02M 3/155 327/108 |
| 6,891,426 | B2* | 5/2005 | Zeng | H02M 3/073 327/415 |
| 6,975,164 | B1* | 12/2005 | Matsui | G05F 1/565 323/316 |
| 7,356,213 | B1 | 4/2008 | Cunningham et al. | |
| 7,439,798 | B2* | 10/2008 | Kouno | G05F 1/56 327/541 |
| 7,817,880 | B1 | 10/2010 | Drost et al. | |
| 7,840,136 | B1 | 11/2010 | Cunningham et al. | |
| 7,859,325 | B2* | 12/2010 | Chiu | G05F 1/575 327/540 |
| 8,952,747 | B1* | 2/2015 | Shreeve | H03K 19/018507 327/109 |
| 2010/0127345 | A1 | 5/2010 | Sanders et al. | |
| 2010/0225436 | A1 | 9/2010 | Papavasiliou et al. | |
| 2010/0315157 | A1* | 12/2010 | Na | G05F 1/465 327/539 |
| 2011/0042798 | A1 | 2/2011 | Pagaila et al. | |
| 2011/0080150 | A1* | 4/2011 | Wang | H02M 3/156 323/284 |
| 2011/0163414 | A1 | 7/2011 | Lin et al. | |
| 2011/0291786 | A1 | 12/2011 | Li et al. | |
| 2012/0049334 | A1 | 3/2012 | Pagaila et al. | |
| 2012/0181673 | A1 | 7/2012 | Pagaila et al. | |
| 2013/0069239 | A1 | 3/2013 | Kim et al. | |
| 2013/0201316 | A1 | 8/2013 | Binder et al. | |
| 2013/0201406 | A1 | 8/2013 | Ling et al. | |
| 2013/0229926 | A1 | 9/2013 | Lu et al. | |
| 2014/0070422 | A1 | 3/2014 | Hsiao et al. | |

OTHER PUBLICATIONS

IEEE P802.11ac / D2.0; Draft Standard for Information Technology—Telecommunications and information exchange between systems—Local and metropolitan area networks—Specific requirements; Part 11: Wireless LAN Medium Access Control (MAC) and Physical Layer (PHY) specifications; Amendment 4: Enhancements for Very High Throughput for Operation in Bands below 6 GHz; Prepared by the 802.11 Working Group of the 802 Committee; Jan. 2012; 359 pages.

IEEE Std 802.20/2008; IEEE Standard for Local and metropolitan area networks; Part 20: Air Interface for Mobile Broadband Wireless Access Systems Supporting Vehicular Mobility—Physical and Media Access Control Layer Specification; IEEE Computer Society; Sponsored by the LAN/MAN Standards Committee; Aug. 29, 2008; 1032 pages.

IEEE Std. 802.Nov. 2012; IEEE Standard for Information technology—Telecommunications and information exchange between systems Local and metropolitan area networks—Specific requirements; Part 11: Wireless LAN Medium Access Control (MAC) and Physical Layer (PHY) Specifications; IEEE Computer Society; Sponsored by the LAN/MAN Standards Committee; Mar. 29, 2012; 2793 pages.

802.16-2009 IEEE Standard for Local and Metropolitan area networks; Part 16: Air Interface for Broadband Wireless Access Systems; IEEE Computer Society and the IEEE Microwave Theory and Techniques Society; Sponsored by the LAN/MAN Standard Committee; May 29, 2009; 2082 pages.

"Specification of the Bluetooth System" Master Table of Contents & Compliance Requirements—Covered Core Package version: 4.0; Jun. 30, 2010; 2302 pages.

IEEE P802.11ah / D1.0 (Amendment to IEEE Std 802.11REVmc / D1.1, IEEE Std 802.11ac / D5.0 and IEEE Std 802.11af / D3.0) Draft Standard for Information technology—Telecommunications and information exchange between systems Local and metropolitan area networks—Specific requirements; Part 11: Wireless LAN Medium Access Control (MAC) and Physical Layer (PHY) Specifications; Amendment 6: Sub 1 GHz License Exempt Operation; Prepared by the 802.11 Working Group of the LAN/MAN Standards Committee of the IEEE Computer Society; Oct. 2013; 394 pages.

802.20 V14; Draft 802.20 Permanent Document; System Requirements for IEEE 802.20 Mobile Broadband Wireless Access Systems—Version 14; Jul. 16, 2004; 24 pages.

IEEE Std. 802.3—2002 (Revision of IEEE Std. 802.3, 2000 Edition); IEEE Standard for Information technology—Telecommunications and information exchange between systems—Local and metropolitan area networks—Specific requirements; Part 3: Carrier sense multiple access with collision detection (CSMA/CD) access method and physical layer specifications; IEEE Computer Society; Sponsored by the LAN/MAN Standards Committee; Mar. 8, 2002; 1538 pages.

IEEE P802.11 Wireless LANs; Proposed Specification Framework for TGah; Minyoung Park; Mar. 12, 2012; 13 pages.

Invitation to Pay Additional Fees for PCT Application No. PCT/US2015/016889 dated Jun. 1, 2015; 7 pages.

Invitation to Pay Additional Fees for PCT Application No. PCT/US2015/016823 dated Jun. 1, 2015; 6 pages.

IEEE P802.11ac / D2.1; Draft Standard for Information Technology—Telecommunications and information exchange between systems—Local and metropolitan area networks—Specific requirements; Part 11: Wireless LAN Medium Access Control (MAC) and Physical Layer (PHY) specifications; Amendment 4: Enhancements for Very High Throughput for Operation in Bands below 6 GHz; Prepared by the 802.11 Working Group of the 802 Committee; Mar. 2012; 363 pages.

* cited by examiner

METHOD AND APPARATUS FOR PROVIDING A REGULATED OUTPUT VOLTAGE VIA A VOLTAGE REGULATOR BASED ON MULTIPLE VOLTAGE REFERENCES

CROSS-REFERENCE TO RELATED APPLICATIONS

The present disclosure is a continuation of U.S. patent application Ser. No. 14/190,729 (now U.S. Pat. No. 8,952, 747), filed Feb. 26, 2014. This application claims the benefit of U.S. Provisional Application No. 61/770,701, filed on Feb. 28, 2013. The entire disclosure of the application referenced above is incorporated herein by reference.

FIELD

The present disclosure relates to voltage regulators, and more particularly to non-linear voltage regulators.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Voltage regulators receive an input voltage reference and supply an output voltage reference to another circuit such as a chip core or output drivers. While the input voltage reference may vary, the voltage regulator attempts to regulate the output voltage reference. For example, fluctuation of the output voltage reference may need to be regulated within a predetermined range of a predetermined voltage level.

The voltage regulator may be implemented by an integrated circuit (IC) along with the chip core and/or the output drivers. To perform voltage regulation, the voltage regulator usually requires a relatively large capacitor that is either attached externally to a pin of the IC or integrated in the IC.

SUMMARY

A voltage regulator includes a comparing circuit configured to compare a first voltage reference to a second voltage reference and to generate an output. A first circuit is configured to apply gain to the output of the comparing circuit and to buffer the output of the comparing circuit. A first transistor includes a gate in communication with an output of the first circuit, a first terminal in communication with a first voltage reference and a second terminal in communication with an output of the voltage regulator. A second circuit is configured to apply gain to the output of the first circuit and to buffer the output of the first circuit. A latching circuit is configured to receive an output of the second circuit. A voltage reference circuit is configured to generate the second voltage reference based on the output of the voltage regulator. A reference adjusting circuit is configured to receive an output of the latching circuit and to selectively adjust the second voltage reference.

In other features, a capacitor is connected to the output of the voltage regulator. The capacitor has a value in a range from 10 pF to 200 pF.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

In the drawings, reference numbers may be reused to identify similar and/or identical elements.

DESCRIPTION

Figure 1:
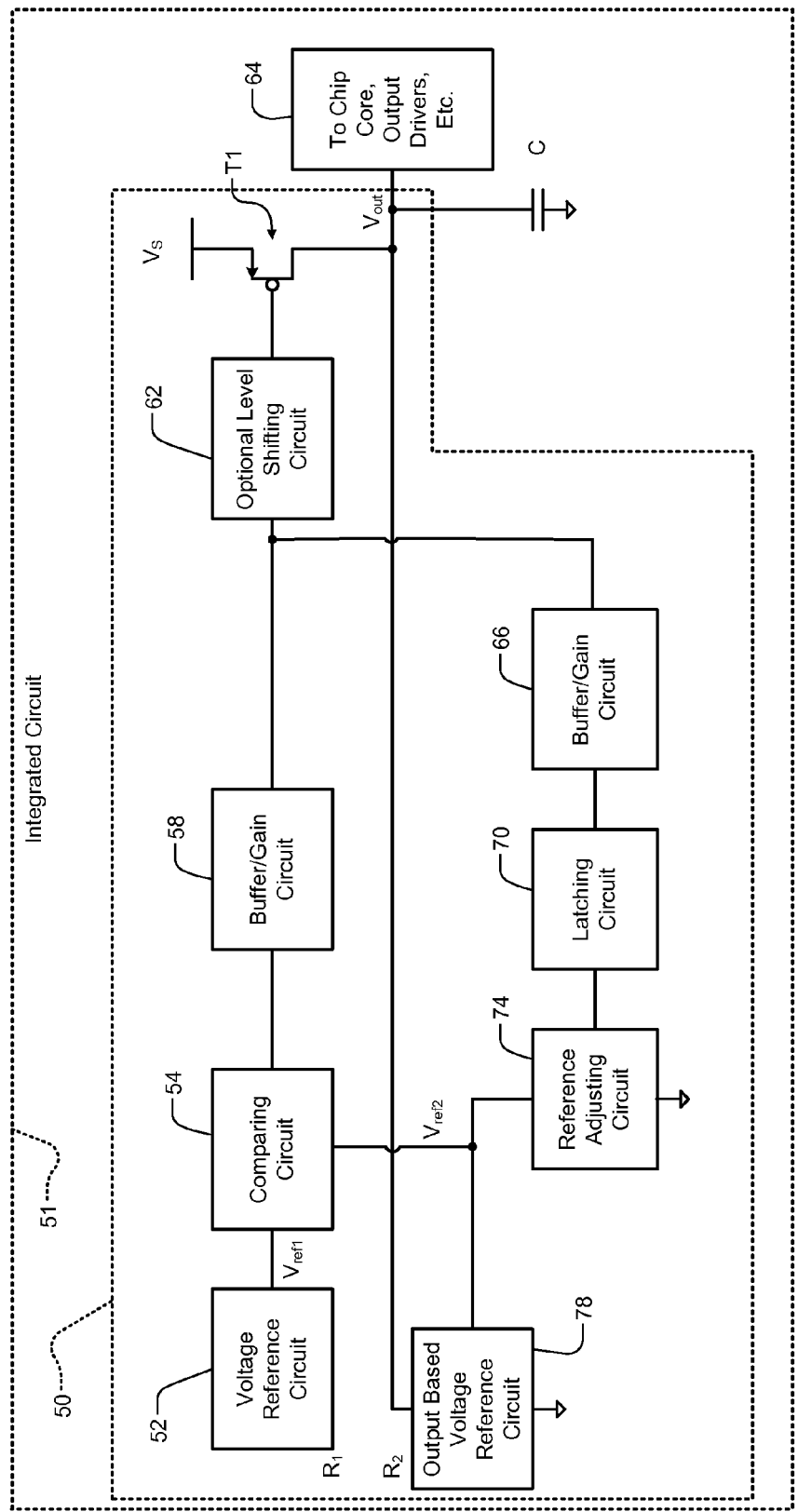
FIG. 1 is a functional block diagram and electrical schematic of an example of a voltage regulator according to the present disclosure.

FIG. 1 shows of an example of a voltage regulator 50 according to the present disclosure. The voltage regulator 50 may be implemented in an integrated circuit 51. A voltage reference circuit 52 generates and outputs a first voltage reference $V_{ref1}$ to a first input of a comparing circuit 54. A second input of the comparing circuit 54 receives a second voltage reference $V_{ref2}$. The comparing circuit 54 compares the first voltage reference $V_{ref1}$ to the second voltage reference $V_{ref2}$ and generates a high or low signal based on the comparison. The second voltage reference $V_{ref2}$ may be based on an output voltage of the voltage regulator 50.

A buffer/gain circuit 58 applies gain and provides buffering to a signal output by the comparing circuit 54. An optional level shifting circuit 62 may be used to adjust a signal level of the output of the buffer/gain circuit 58. For example, the level shifting circuit 62 may shift a voltage level from a first voltage level to a second voltage level.

An output of the level shifting circuit 62 (or the buffer/gain circuit 58) is input to a gate of a transistor T1. A first terminal of the transistor T1 is connected to a voltage reference $V_S$. A second terminal of the transistor T1 is connected to an output node of the voltage regulator $V_{out}$. In some examples, the output node of the voltage regulator 50 is connected to a chip core, output drivers, etc. 64 and a capacitor C. The transistor T1 is OFF when the output voltage $V_{out}$ is above a target voltage level and ON when the output voltage $V_{out}$ falls below the target voltage level.

An output of the buffer/gain circuit 58 is also connected to a buffer/gain circuit 66, which applies gain and provides buffering to the output of the buffer/gain circuit 58. The increased gain minimizes the possibility of a stable intermediate state and conditions the signal for input to a latching circuit 70. The latching circuit 70 forces an output of the buffer/gain circuit 66 either high or low and prevents stable intermediate states between high or low.

An output of the latching circuit 70 is input to a reference adjusting circuit 74. The output $V_{out}$ of the voltage regulator 50 is fed back a voltage reference circuit 78. The voltage reference circuit 78 and/or the reference adjusting circuit 74 set a value of the second voltage reference $V_{ref2}$ supplied to the comparing circuit 54. During one mode, the voltage reference circuit 78 sets the second voltage reference $V_{ref2}$, and during another mode, the voltage reference circuit 78 and the reference adjusting circuit 74 set the second voltage reference $V_{ref2}$. The reference adjusting circuit 74 helps to define an acceptable voltage range for the output voltage and to prevent the transistor T1 from oscillating on and off.

Figure 2:
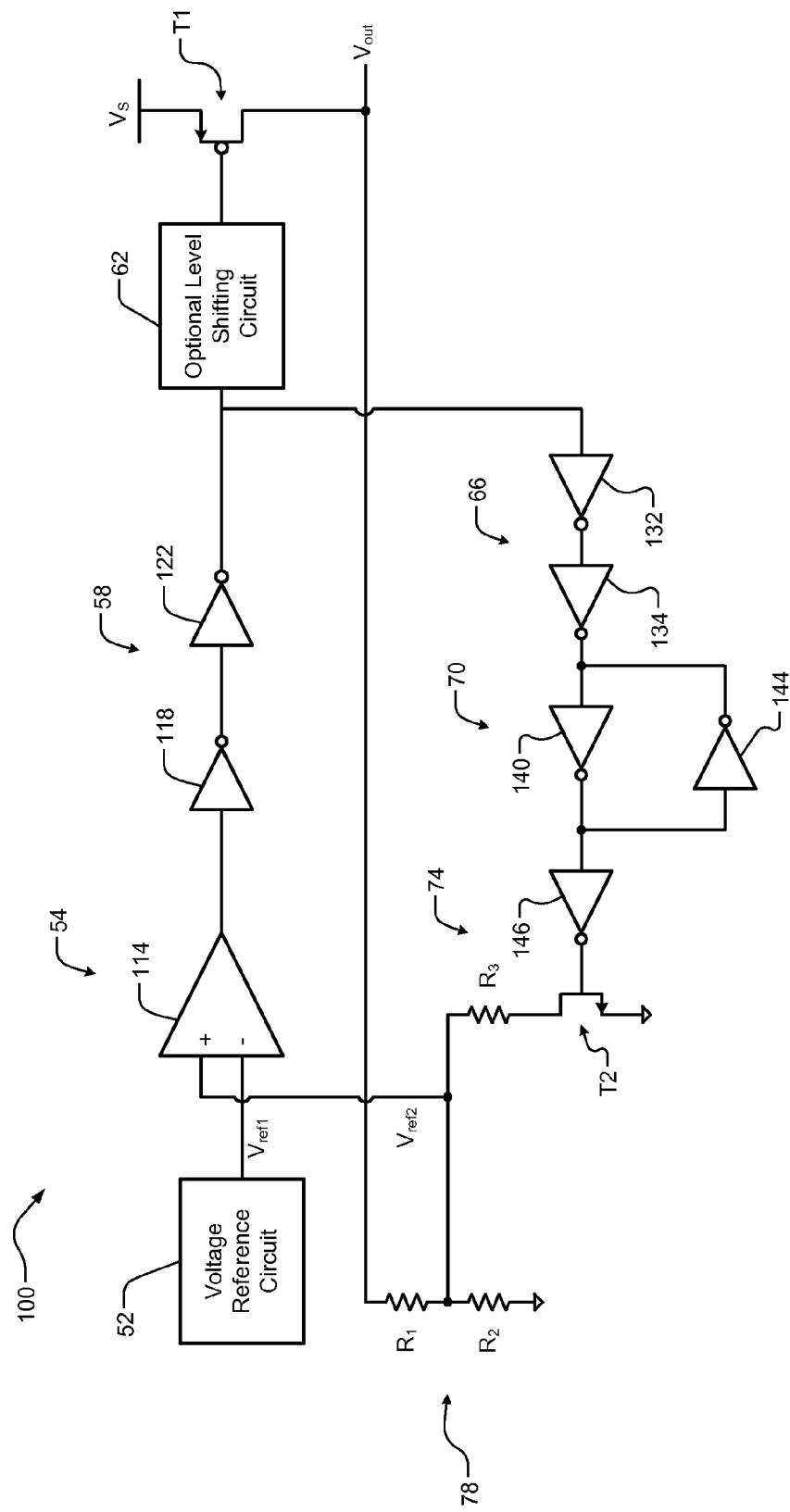
FIG. 2 is a functional block diagram and electrical schematic of another example of a voltage regulator according to the present disclosure.

FIG. 2 shows another example of a voltage regulator 100 according to the present disclosure. The voltage regulator 100 may be implemented in an integrated circuit. The voltage reference circuit 52 generates and outputs a first voltage reference $V_{ref1}$ and outputs the first voltage reference $V_{ref1}$ to the comparing circuit 54. The comparing circuit 54 compares the voltage reference $V_{ref1}$ to the second voltage reference $V_{ref2}$ and generates a high or low signal based on the comparison. The comparing circuit 54 may include an amplifier or operational amplifier (opamp) 114 having an inverting input connected to the voltage reference $V_{ref1}$ from the voltage reference circuit 52 and a non-inverting input connected to the second voltage reference $V_{ref2}$.

The second voltage reference $V_{ref2}$ may be based on an output voltage of the voltage regulator 100. The buffer/gain circuit 58 applies gain and provides buffering to the output of the comparing circuit 54. The buffer/gain circuit 58 may include first and second inverters 118 and 122, respectively, connected in series to an output of the comparing circuit 54. An output of the second inverter 122 is connected to an input of the optional level shifting circuit 62 (when used) or to the gate of the transistor T1. The transistor T1 may include a PMOS transistor.

The output of the buffer/gain circuit 58 is connected to the buffer/gain circuit 66, which provides increased gain and buffering to the output of the buffer/gain circuit 58. The buffer/gain circuit 66 may include first and second inverters 132 and 134 that are connected in series.

The latching circuit 70 is connected to the output of the buffer/gain circuit 66. The latching circuit 70 forces the output of the buffer/gain circuit 70 either high or low and prevents intermediate states. The latching circuit 70 may include a first inverter 140 and a second inverter 144. The second inverter 144 has an input connected to an output of the first inverter 142 and an output connected to the input of the first inverter 142.

The output of the latching circuit 70 is input to the reference adjusting circuit 74. The reference adjusting circuit 74 may include a resistor R3, an inverter 146, and a transistor T2. The inverter 146 includes an input connected to a gate of the transistor T2. The transistor T2 may include an NMOS transistor. One end of the resistor R3 is connected to a first terminal of the transistor T2. A second terminal of the transistor T2 is connected to a reference potential. Another end of the resistor R3 is connected to the output-based voltage reference circuit 78.

The output $V_{out}$ of the voltage regulator 100 is fed back to the voltage reference circuit 78. The voltage reference circuit 78 adjusts the output voltage $V_{out}$ to a voltage that is comparable to the first reference voltage $V_{ref1}$. The voltage reference circuit 78 and the reference adjusting circuit 74 set a value of the second voltage reference $V_{ref2}$ supplied to the comparing circuit 54. The voltage reference circuit 78 may include a voltage divider circuit including first and second resistors R1 and R2.

During one mode, the voltage reference circuit 78 sets the second voltage reference $V_{ref2}$, and during another mode, the voltage reference circuit 78 and the reference adjusting circuit 74 set the second voltage reference $V_{ref2}$. More particularly in FIG. 2, the resistor R3 is selectively connected to the resistors R1 and R2 to adjust the second reference voltage $V_{ref2}$ that is input to the comparing circuit 54.

Figure 3A:
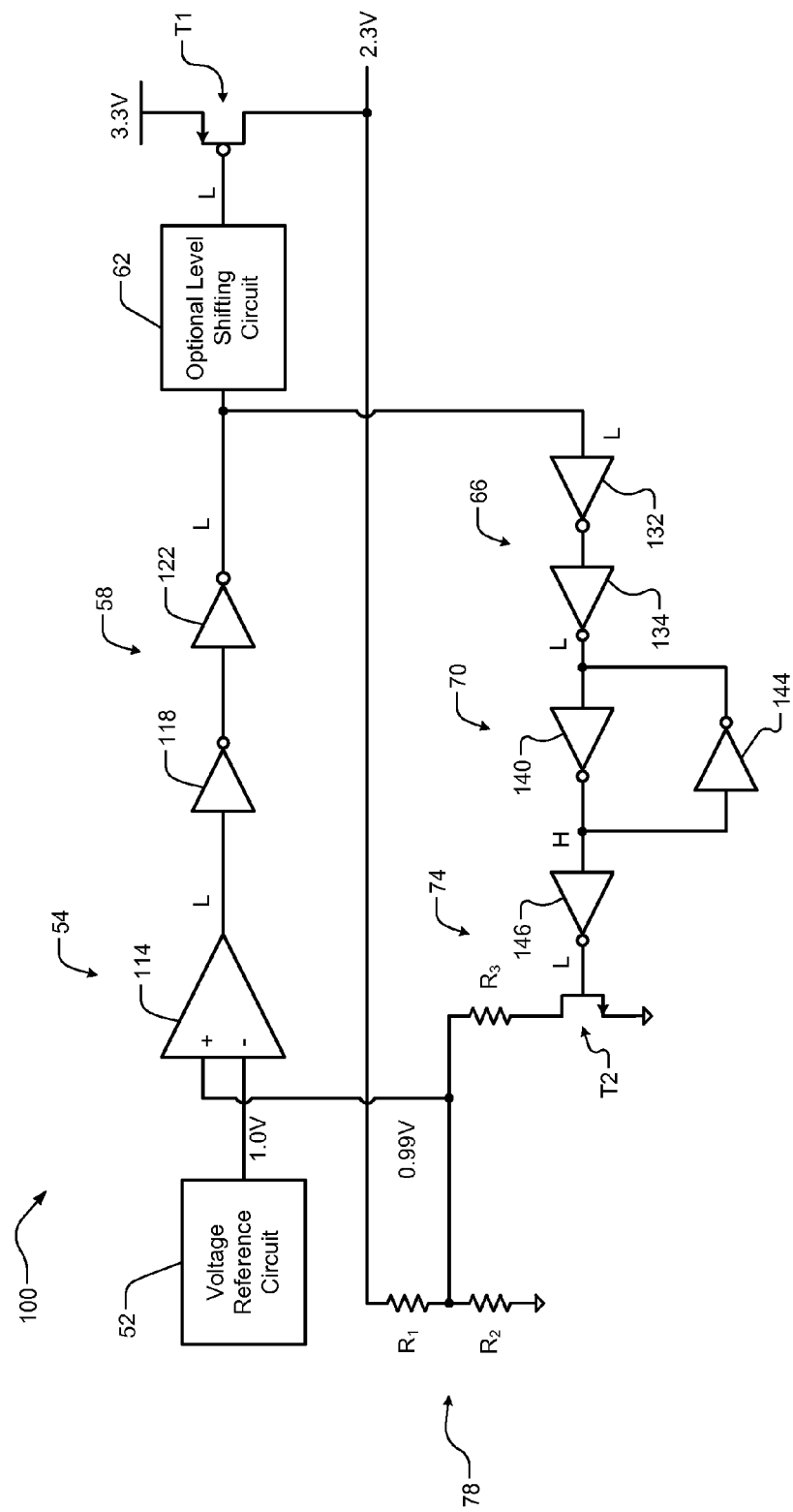
FIGS. 3A and 3B illustrate the voltage regulator of FIG. 2 in different states during operation.
Figure 3B:
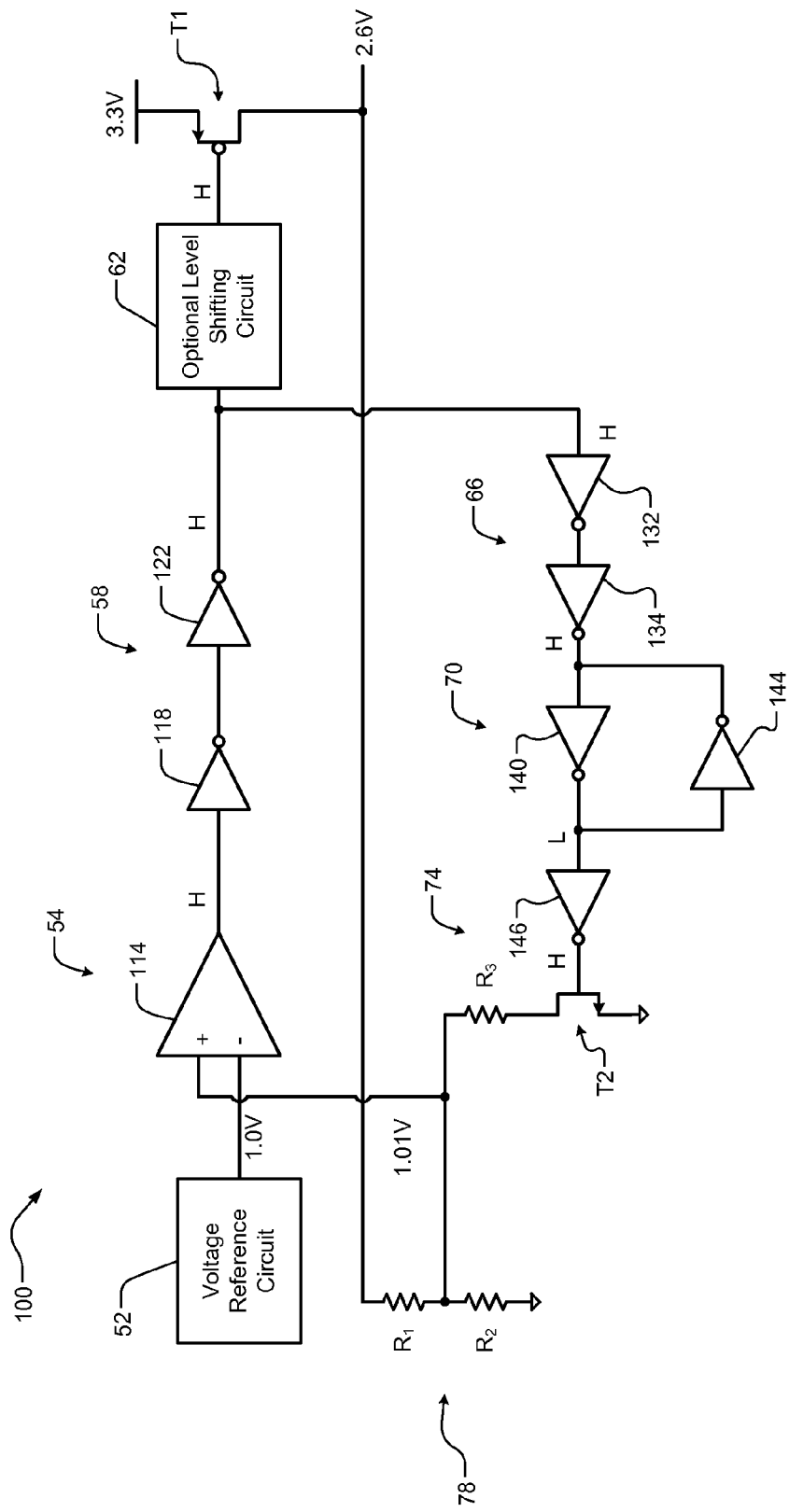

FIGS. 3A and 3B illustrate the voltage regulator 100 of FIG. 2 in different states. FIG. 3A illustrates the voltage regulator 100 when the second voltage reference $V_{ref2}$ is less than the first voltage reference $V_{ref1}$. Example voltage reference levels are presented herein for purposes of illustration only. In this example, the voltage regulator is regulating to a target voltage level of 2.5V. The voltage supply is 3.3V. The voltage reference circuit 78 generates a 1.0V reference. When the output voltage is at 2.3V, the voltage reference circuit 78 generates a reference voltage of 0.99V and the voltage reference adjusting circuit 74 does not impact the second voltage reference $V_{ref2}$.

In this example, the output of the comparing circuit 54 is low. The transistor T1 is ON and the output is pulled towards 3.3V. The optional level shifting circuit 62 is used to shift the voltage from 2.5V to 3.3V to allow the drive transistor T1 to be turned ON and OFF. The input of the buffer/gain circuit 66 is low, which means that the output of the inverter 146 is high. The transistor T2 is OFF. Therefore, the resistor R3 is not connected to ground and does not affect the second voltage reference $V_{ref2}$. With the resistor R3 disconnected in this manner, the second voltage reference is based on:

$$V_{ref2} = V_{S2} \frac{R_2}{R_1 + R_2} \quad (1)$$

In FIG. 3B, eventually the output voltage is pulled higher than the target voltage level. The state of the comparing circuit 54 goes high, which changes the state of the transistor T1 to off and the state of the transistor T2 to on. With the resistor R3 connected in this manner, the second voltage reference is based on:

$$V_{ref2} = V_{S2} \frac{R_2 \| R3}{R_1 + R_2 \| R3} \quad (2)$$

$$\text{where } R_2 \| R_3 = \frac{R_2 R_3}{R_2 + R_3} \quad (3)$$

The voltage regulator turns on the transistor T1 when the output voltage $V_{out}$ falls below an acceptable level. To minimize the possibility that the output voltage $V_{out}$ increases to an excessively high voltage, the feedback path including elements 54, 58, 62, 66, 70, 74 and 78 runs very fast. Digital elements in this path (elements 58, 66 and 70) provide high switching speed and low capacitive loading so that the overall path can respond very quickly.

The voltage regulators according to the present disclosure rely less upon large capacitors (typically about 1 μF to about 20 μF) and performs most of the smoothing inside the voltage regulator. As a result, the capacitor can be a factor of 10,000 times smaller while still supporting large supply currents. For example, the capacitor C may be about 10 pF to about 200 pF. Additional capacitors are not required for voltage regulation. Therefore, the capacitor can be implemented on-chip with significantly lower cost, reduced die size and without using an extra pin for an external capacitor.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

What is claimed is:

1. A voltage regulator comprising:
   a comparing circuit configured to (i) compare a first voltage reference to a second voltage reference, and (ii) generate an output based on the comparison between the first voltage reference and the second voltage reference;
   a first circuit configured to amplify the output of the comparing circuit;
   a first transistor comprising (i) a gate configured to receive a first output of the first circuit, (ii) a first terminal connected to a voltage supply terminal, and (iii) a second terminal, wherein a regulated output voltage of the voltage regulator is based on a voltage at the second terminal of the first transistor;
   a voltage reference circuit configured to generate the second voltage reference based on the voltage at the second terminal of the first transistor; and
   a latching circuit configured to, based on a second output of the first circuit, (i) generate an output to adjust the second voltage reference, and (ii) switch between (a) forcing the second output of the first circuit to be in a first state to (b) forcing the second output of the first circuit to be in a second state.

2. The voltage regulator of claim 1, wherein the first circuit comprises:
   a second circuit configured to apply a gain to the output of the comparing circuit to generate the first output of the first circuit; and
   a third circuit configured to apply a gain to an output of the second circuit to generate the second output of the first circuit.

3. The voltage regulator of claim 2, wherein:
   the second circuit comprises a first inverter connected in series with a second inverter; and
   the third circuit comprises a third inverter connected in series with a fourth inverter, wherein the third inverter is connected in series with the second inverter.

4. The voltage regulator of claim 1, further comprising a reference adjusting circuit configured to (i) receive the output of the latching circuit, and (ii) selectively adjust the second voltage reference based on the output of the latching circuit.

5. The voltage regulator of claim 1, further comprising a reference adjusting circuit, wherein:
   during a first mode, the voltage reference circuit is configured to set the second voltage reference, and
   during a second mode, the voltage reference circuit and the reference adjusting circuit are configured to set the second voltage reference.

6. The voltage regulator of claim 1, wherein:
   the latching circuit prevents the second output of the first circuit from being in an intermediate state; and
   the intermediate state is between the first state and the second state.

7. The voltage regulator of claim 1, wherein:
   the latching circuit comprises (i) a first inverter having a first input and a first output, and (ii) a second inverter having a second input and a second output;
   the first input of the first inverter is connected to the second output of the second inverter; and
   the first output of the first inverter is connected to the second input of the second inverter.

8. The voltage regulator of claim 1, wherein:
   the voltage reference circuit comprises a second transistor;
   the second transistor comprises a gate, a first terminal, and a second terminal;
   the gate of the second transistor is controlled based on the output of the latching circuit;
   the second voltage reference is based on a voltage at the first terminal of the second transistor; and
   the second terminal of the second transistor is connected to a reference terminal.

9. A voltage regulator of claim 1, further comprising a capacitor connected between (i) the second terminal of the first transistor and the voltage reference circuit and (ii) a reference terminal.

10. A voltage regulator comprising:
    a comparing circuit configured to (i) compare a first voltage reference to a second voltage reference, and (ii) generate an output based on the comparison between the first voltage reference and the second voltage reference;
    a first circuit configured to amplify the output of the comparing circuit;
    a first transistor comprising (i) a gate configured to receive a first output of the first circuit, (ii) a first terminal connected to a voltage supply terminal, and (iii) a second terminal, wherein a regulated output voltage of the voltage regulator is based on a voltage at the second terminal of the first transistor;
    a voltage reference circuit configured to generate the second voltage reference based on the voltage at the second terminal of the first transistor; and
    a reference adjusting circuit configured to selectively adjust the second voltage reference based on the first output of the first circuit.

11. The voltage regulator of claim 10, further comprising a latching circuit configured to force a second output of the first circuit to be in either a first state or a second state, wherein the first circuit applies a gain to the first output of the first circuit to generate the second output of the first circuit.

12. The voltage regulator of claim 11, wherein:
    the latching circuit prevents the second output of the first circuit from being in an intermediate state; and
    the intermediate state is between the first state and the second state.

13. The voltage regulator of claim 11, wherein the first circuit comprises:
    a second circuit configured to apply a gain to the output of the comparing circuit to generate the first output of the first circuit; and
    a third circuit configured to apply a gain to an output of the second circuit to generate the second output of the first circuit.

14. The voltage regulator of claim 10, wherein:
    the voltage reference circuit comprises a second transistor;
    the second transistor comprises a gate, a first terminal, and a second terminal;
    the gate of the second transistor is controlled based on the first output of the first circuit;
    the second voltage reference is based on a voltage at the first terminal of the second transistor; and
    the second terminal of the second transistor is connected to a reference terminal.

15. A method of operating a voltage regulator, the method comprising:
- comparing a first voltage reference to a second voltage reference via a comparing circuit;
- generating an output based on the comparison between the first voltage reference and the second voltage reference;
- amplifying the output of the comparing circuit via a first circuit;
- receiving a first output of the first circuit at a gate of a first transistor, wherein a first terminal of the first transistor is connected to a voltage supply terminal, and wherein a regulated output voltage of the voltage regulator is based on a voltage at a second terminal of the first transistor;
- generating the second voltage reference based on the voltage at the second terminal of the first transistor; and
- based on a second output of the first circuit, (i) generating an output via a latching circuit to adjust the second voltage reference, and (ii) switching between (a) forcing the second output of the first circuit to be in a first state to (b) forcing the second output of the first circuit to be in a second state.

16. The method of claim 15, further comprising:
- applying a gain to the output of the comparing circuit to generate the first output of the first circuit; and
- applying a gain to the first output of the first circuit to generate the second output of the first circuit.

17. The method of claim 15, further comprising:
- receiving the output of the latching circuit; and
- selectively adjusting the second voltage reference based on the output of the latching circuit.

18. The method of claim 15, further comprising preventing the second output of the first circuit from being in an intermediate state, wherein the intermediate state is between the first state and the second state.

19. The method of claim 15, further comprising controlling a gate of a second transistor based on the output of the latching circuit, wherein:
- the second transistor comprises a gate, a first terminal, and a second terminal;
- the second voltage reference is based on a voltage at the first terminal of the second transistor; and
- the second terminal of the second transistor is connected to a reference terminal.

20. The method of claim 15, further comprising:
- shifting the first output of the first circuit; and
- controlling the gate of the first transistor based on the shifted first output of the first circuit.

* * * * *